(12) United States Patent
Fuller

(10) Patent No.: US 11,363,743 B2
(45) Date of Patent: Jun. 14, 2022

(54) RACK FOR COOLING COMPUTING DEVICES

(71) Applicant: Core Scientific, Inc., Bellevue, WA (US)

(72) Inventor: Thomas Fuller, Seattle, WA (US)

(73) Assignee: Core Scientific, Inc., Bellevue, WA (US)

(*) Notice: Subject to any disclaimer, the term of this patent is extended or adjusted under 35 U.S.C. 154(b) by 0 days.

(21) Appl. No.: 16/938,565

(22) Filed: Jul. 24, 2020

(65) Prior Publication Data

US 2022/0030749 A1 Jan. 27, 2022

(51) Int. Cl.
*H05K 7/20* (2006.01)

(52) U.S. Cl.
CPC .............. *H05K 7/20736* (2013.01)

(58) Field of Classification Search
CPC ............ H05K 7/20736; H05K 7/20745
See application file for complete search history.

(56) References Cited

U.S. PATENT DOCUMENTS

| | | | | |
|---|---|---|---|---|
| 7,724,513 B2* | 5/2010 | Coglitore | ........... | H05K 7/20745 361/679.48 |
| 8,659,895 B1* | 2/2014 | Carlson | .............. | H05K 7/20745 361/695 |
| 10,356,954 B2* | 7/2019 | Bao | ..................... | H05K 7/20736 |
| 2012/0125028 A1* | 5/2012 | Keisling | ............ | H05K 7/20218 165/301 |
| 2012/0162906 A1 | 6/2012 | Jai | | |
| 2020/0042054 A1 | 2/2020 | Papen et al. | | |

FOREIGN PATENT DOCUMENTS

WO 19/173927 A1 9/2019

OTHER PUBLICATIONS

International Search Report and Written Opinion dated Aug. 17, 2021 related to corresponding International Patent Application No. PCT/US2021/032564.

* cited by examiner

*Primary Examiner* — Mukundbhai G Patel
(74) *Attorney, Agent, or Firm* — Fishman Stewart PLLC

(57) ABSTRACT

Systems and methods for cooling large numbers of computing devices in a data center are disclosed. The devices are positioned on shelves in racks and are connected via network switches. The computing devices are oriented so that their cooling fans all exhaust waste heat to one side of the rack into a hot aisle, and each position is offset from positions on neighboring shelves above and below the current shelf. The racks can be offset, or the positions within the racks can be offset. Each computing device on the rack can also be angled horizontally and or vertically to improve airflow. Multiple racks can be configured together into sloped regular polygons, with the interior forming the hot aisle, and deflectors can be installed to further improve airflow.

20 Claims, 18 Drawing Sheets

RACK FOR COOLING COMPUTING DEVICES

TECHNICAL FIELD

The present disclosure generally relates to the field of computing and, more particularly, to systems and methods for cooling large numbers of computing devices in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Data centers housing large numbers of miners or other CPU- or GPU-based systems may face cooling issues. This is due to the density, power usage, heat generation, and duty cycle common to these devices.

The heat in these data centers can exceed the cooling ability of a computing device's built-in fans, which force air across heat sinks on the computing device in order to extract and exhaust the waste heat. Traditional methods for improving cooling of computing devices in data centers include adding additional large external fans to increase airflow across the computing devices and using external cooling units that reduce the temperature of the air that is forced across the computing device by its built-in cooling fans. These methods have a significant drawback in that they use significant amounts of energy on top of the energy already used by the computing devices themselves.

Furthermore, even with these additional cooling methods, hot spots often occur within certain locations in data centers. For example, some compute devices farthest away from the data center's exhaust vents may see reduced airflow and therefore suffer from reduced cooling.

For at least these reasons, there is a desire for a solution to allow for improved efficient cooling of computing devices in a data center.

SUMMARY

An improved system and method for cooling a plurality of computing devices in a data center is contemplated. In one embodiment, the method comprises configuring the plurality of computing devices in a plurality of racks, with each computing device configured to exhaust heat in the same direction that is parallel to the other computing devices on the rack. Instructions are sent to the computing devices to set the computing devices' fan speed in a pattern. For example, the pattern may be linear or nonlinear, e.g., a ramp function or a gradient pattern in one or more directions (e.g. a two-dimensional linear gradient). The gradient pattern may be lower for the computing devices nearer to an exhaust opening and higher for devices farther from an exhaust opening. In some embodiments, the racks may be parallel to each other and exhaust in opposing directions, with the space between the racks bound by impermeable barriers and an exhaust port to funnel exhaust heat out. For example, the gradient pattern may be lower for the computing devices at one end of a rack (near a side exhaust opening) and higher for the computing devices at the other end, or it may be lower for computing devices at the top of a rack (near a top exhaust opening) and higher for devices at the bottom of the rack. Managing device settings such as fan speeds by patterns based for example on the physical location of the computing devices may improve cooling efficiency and ease of management.

A method for managing a data center housing a plurality of computing devices in a plurality of racks and connected via one or more network switches is also contemplated. In one embodiment, each switch may have a plurality of network ports, with each port associated with a different physical device location within the racks. In one embodiment the method may comprise sending instructions to set the fan speed of the computing devices in a pattern based on each computing device's location within the racks (as determined by its network port). The pattern may for example be a linear or non-linear gradient, one or two-dimensional, and may shift, rotate or change over time. Different patterns from a set of predefined patterns may be periodically selected and applied to the computing devices by sending updated management instructions to set the fan speed of the computing devices according to the newly changed or selected pattern. In addition, or in place of fan speed instructions, instructions to set other operating parameters such as operating frequency and or voltage according to a pattern may also be sent to the devices (e.g., with the highest desired frequency sent to devices nearest the exhaust opening, and the lowest desired frequencies sent to devices farthest from the exhaust opening, with a linear gradient being applied to the devices between).

A system for cooling computing devices in a data center is also contemplated. In one embodiment, the system may comprise one or more racks configured to support large numbers of computing devices in a two-dimensional array, with the computing devices each having one or more cooling fans configured to direct exhaust in a first direction perpendicular to the racks on which they are positioned. A control module such as a management computer running a management application may be connected to the computing devices via a network, and the control module may be configured to dispatch management instructions such as cooling fan speed setting instructions to the computing devices in a pattern (e.g. a one or two-dimensional gradient) that can shift, rotate, or change over time.

To further improve cooling, offset (i.e., sloped) computing device positions and or racks may be used, either alone or in combination with the fan pattern settings. A method for operating a plurality of computing devices using sloped computing device positions is also contemplated. In one embodiment, the method comprises positioning the computing devices on a plurality of shelves in one or more racks. The devices are positioned such that each of the computing devices on each of the shelves draw in air from a cold aisle on a first side of the shelf and exhausts hot air to a hot aisle on a second side of the shelf. The area around the computing devices is sealed such that the exhausted hot air cannot pass from the hot aisle to the cold aisle. The computing devices on each shelf are offset horizontally from the computing devices on neighboring shelves to improve airflow into and out of the hot aisle.

The shelves within each rack may be offset horizontally from neighboring racks to form a hot aisle, and the racks may be positioned at an angle horizontally to each other such that the hot aisle is narrower at one end than the other. Some or all of the miners may also be positioned vertically at angle to improve airflow. The hot aisle may have one or more exhaust openings, and the computing devices may be angled horizontally and or vertically to point toward the nearest hot aisle exhaust opening.

A system for supporting a plurality of computing devices in a data center is also contemplated. In one embodiment, the system may comprise a first rack with a plurality of shelves; and a number of vertical support members configured to hold the first plurality of shelves at vertical offsets relative to each other, with each of the shelves having one or more positions for holding one or more computing devices. Each position on each shelf is offset horizontally from the positions on neighboring shelves in the rack to improve airflow into and out of the hot aisle.

The system may also include a second rack that is offset from the first rack to form a hot aisle between the first rack and the second rack. Each rack may have vertical support members and a barrier that prevents airflow into the hot aisle except through a number of openings that permit exhaust from the computing devices to pass into the hot aisle.

The computing devices in the racks may each be positioned into a sloped array (relative to vertical), with the sloped arrays being closer at the top than at the bottom in some embodiments and closer at the bottom than the top in other embodiments. The racks may also be positioned closer to each other at one horizontal end than the other to improve airflow. For example, the ends of opposing racks that are closer to the hot aisle's exhaust opening may be farther apart from each other than the other ends of the racks that are farthest away from the hot aisle's exhaust opening. An air deflector may be positioned between the racks to direct heated exhaust air from the computing devices on the racks to the nearest hot aisle exhaust opening. The shelves may be configured to support the computing devices at an angle vertically, horizontally, or both. For example, each shelf may be configured to support the computing devices in a position that directs their heated exhaust air in a direction that is closer toward the nearest hot aisle exhaust opening than merely being pointed straight out from (i.e., perpendicular to) the shelf.

In another embodiment, a set of racks may be positioned together to form a regular polygon (e.g., a square, or hexagon) to form a hot aisle between the racks. Each rack may include a number of shelves and vertical support members configured to hold the shelves in vertically offset positions from each other. Each shelf may have one or more positions for holding computing devices, with each position on each shelf offset horizontally from the positions above and below it on neighboring shelves. Each position may be farther from a vertical line at the center of the regular polygon than the positions below, and some or all of the positions may be angled vertically, horizontally, or both to better direct exhaust to the nearest exhaust port. An air deflector may also be positioned at or near the center of the regular polygon to further improve airflow.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
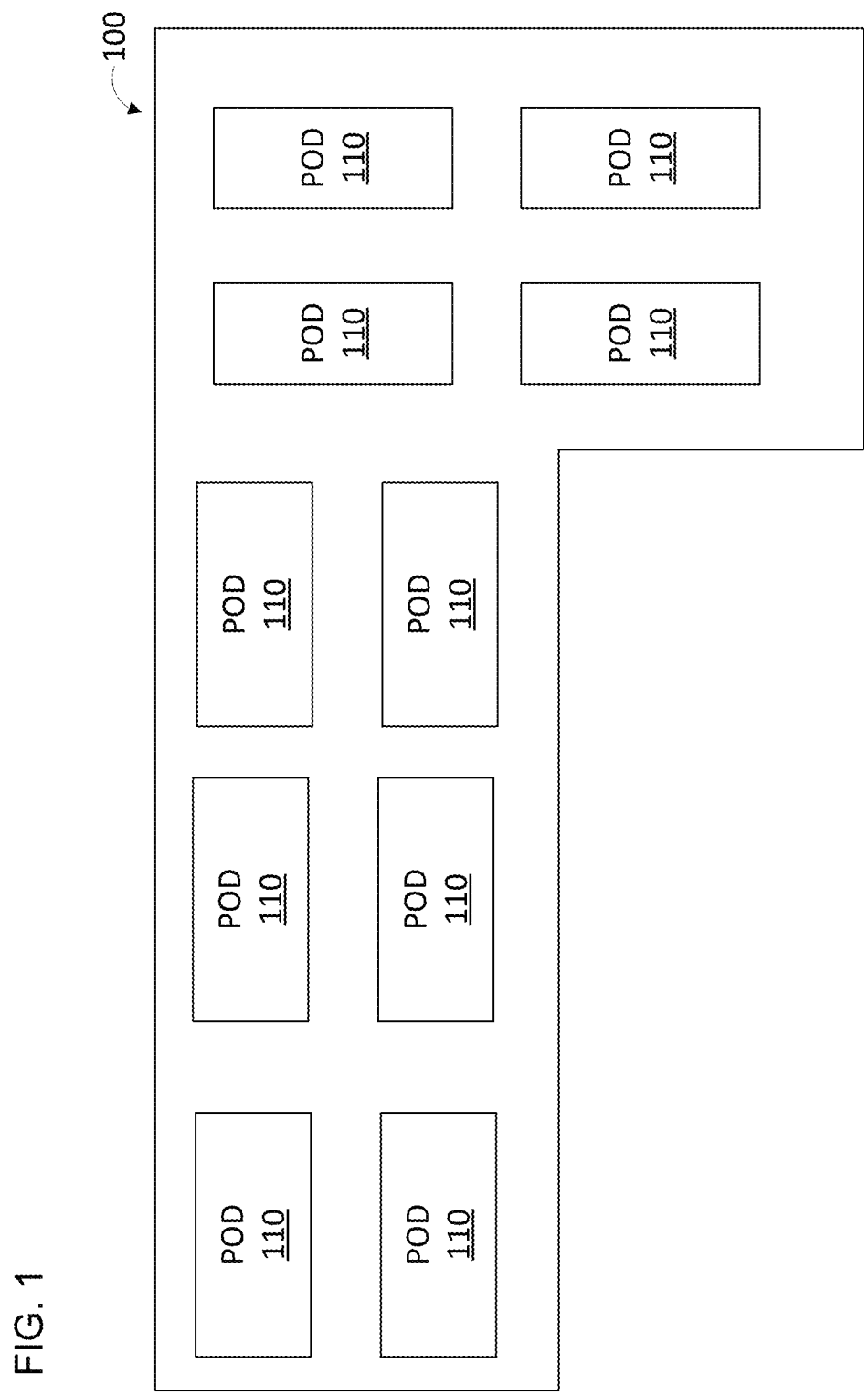
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned at one end of each pod or above the center of each pod) to capture the hot waste air and then discharge it out of the data center via vents in the roof of the data center.

Figure 2:
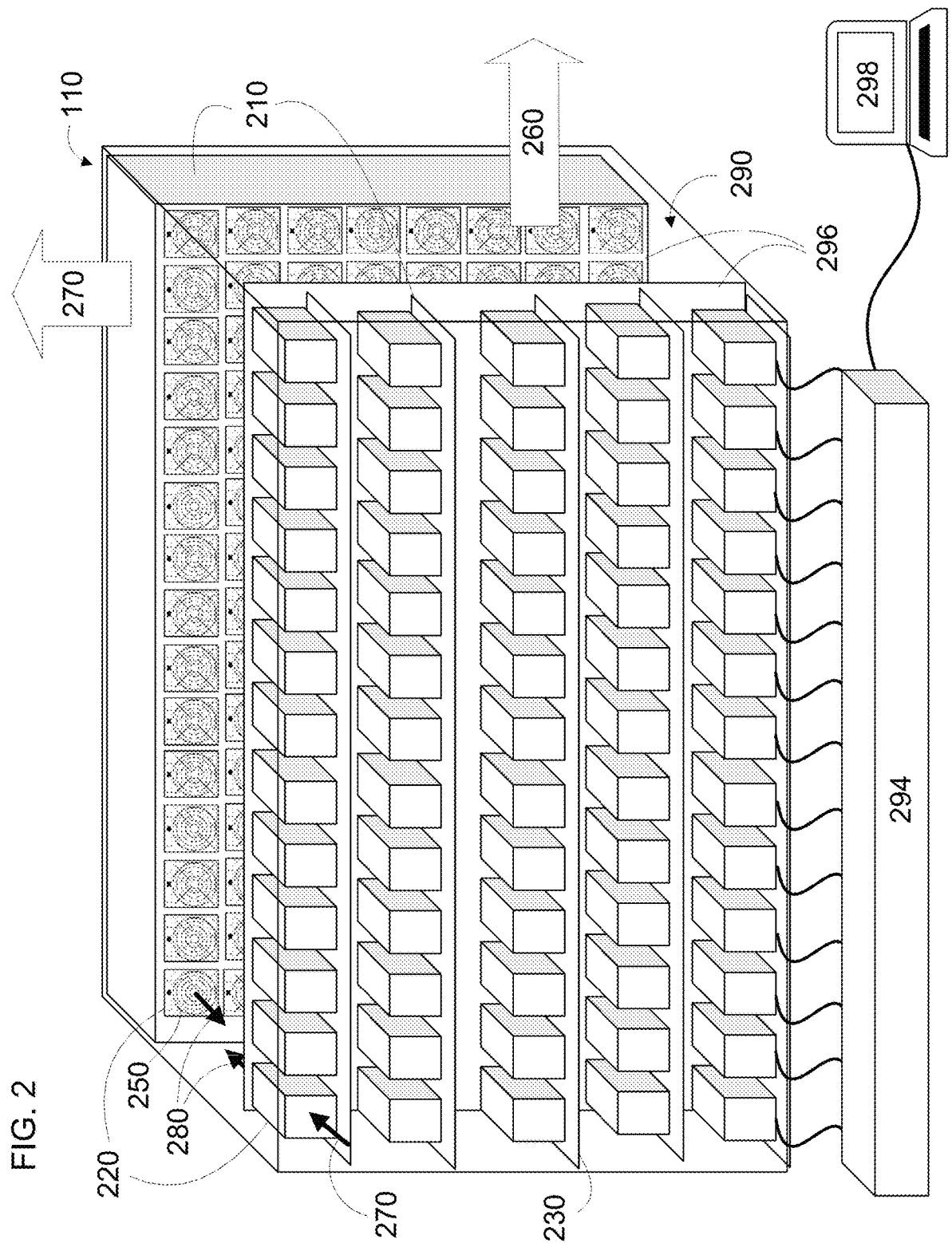
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used within computing device 220. Heated air is exhausted by computing devices 220 into the space 290 between racks 210, often called a hot aisle. The space between racks 210 is typically sealed except for one or more exhaust openings through which the heated air exits. In some embodiments, these openings may be at the side, with heated air exiting as indicated by arrow 260. In other embodiments, these exhaust openings may be located at the top of hot aisle 290 with the heated air exiting above the pod as indicated by arrow 270. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information) and results of the computing jobs to be returned. Switch 294 may also be connected to other networks such as the internet, as well as a management computer 298 that is configured to execute a management application to manage computing devices 220. Management computer 298 may be a traditional PC or server, or specialized appliance. Management server 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management computer 298 as a stand-alone software package, partly on the management computer 298 and partly on a remote computer or computing devices 220, or entirely on a remote computer or computing devices 220.

In order to better cool computing devices 220, the management application may be configured to dispatch instructions to computing devices 220 setting their fan speeds according to one or more predetermined patterns as described in greater detail below. While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of pattern (e.g., linear gradient or cubic). With this information the management application may then automatically calculate the values (e.g., fan speed settings) for each computing device based on the distribution of the computing devices on the rack. In another embodiment, the management application may prompt the user to fill in one or more grids (as shown for example in FIG. 7) with values for each pattern. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

Figure 3:
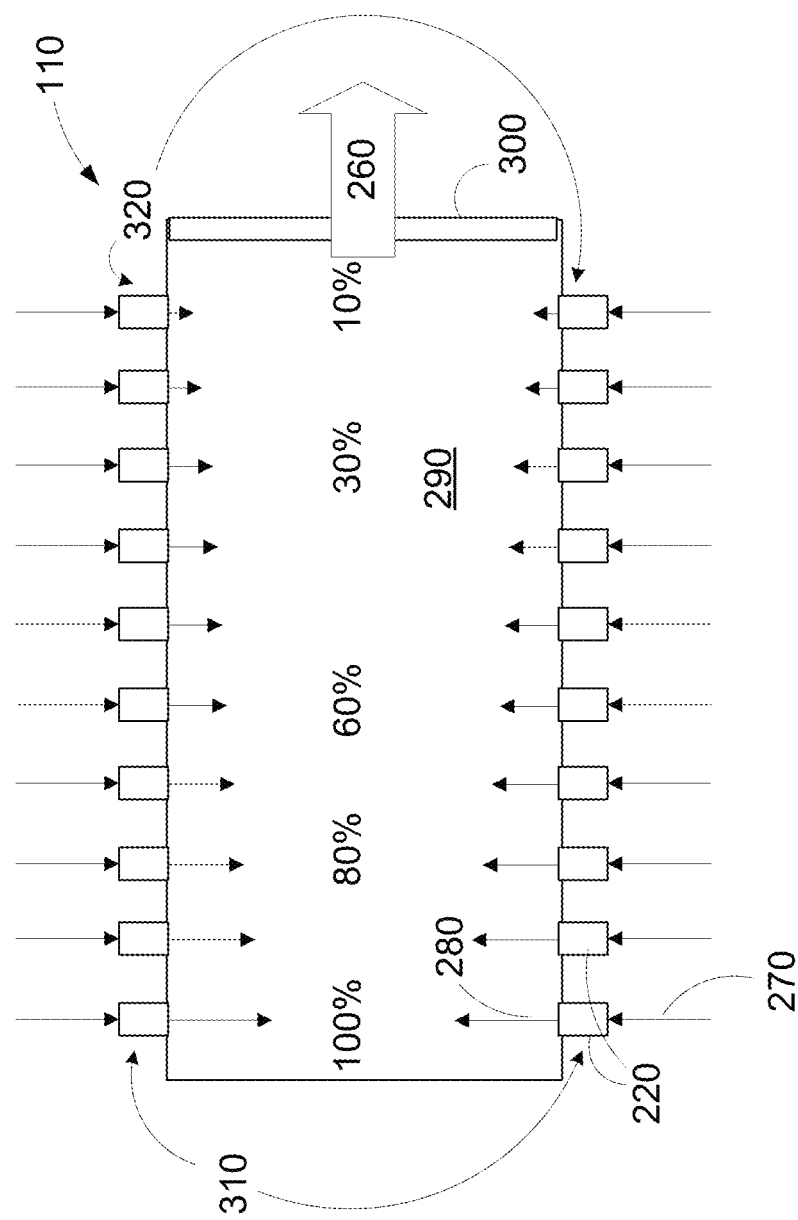
FIG. 3 is a top view of an example embodiment of a system for cooling computing devices in a data center according to the teachings of the present disclosure.

Turning now to FIG. 3, a top down view of an example embodiment of a system for cooling computing devices 220 in a pod 110 in a data center is shown. In this example, computing devices 220 exhaust hot air into hot aisle 290, which is sealed to prevent the hot air from exiting except through exhaust opening 300, as illustrated by arrow 260. To more efficiently and better cool computing devices 220, instructions are sent to computing devices 220 setting their fan speeds according to a pattern. In this example, the pattern starts at maximum fan speed (100%) for computing devices that are farthest from the exhaust opening. In this example, those devices are in columns 310. The pattern then reduces the fan output slightly (e.g., by 10%) for computing devices 220 in each neighboring column, reaching a predetermined minimum fan space (e.g., 10%) for the computing devices in columns 320, which are nearest to the exhaust opening 300.

Figure 4:
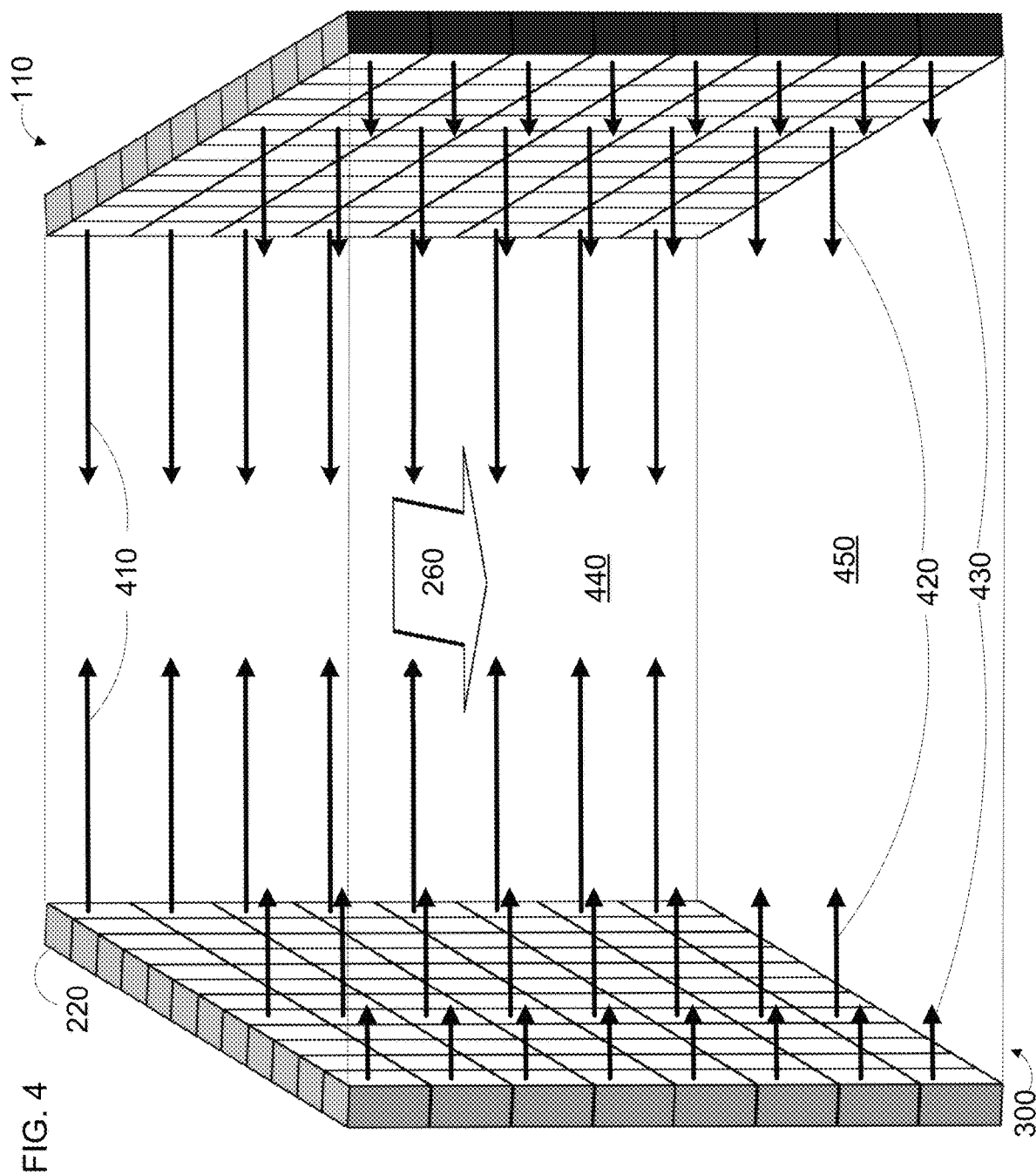
FIG. 4 is a perspective view of an example embodiment of a fan cooling pattern applied to an example pod in a data center according to the teachings of the present disclosure.

Turning now to FIG. 4, a perspective view of the example embodiment from FIG. 3 is shown with each cube representing a computing device 220 and arrows indicating the approximate direction of exhaust and relative fan speed. The top, back 440, and floor 450 of the space between the racks of computing devices 220 are sealed, with one side being open as an exhaust opening 300. The pattern of fan settings applied to computing devices 220 is a gradient in this example embodiment, with fan speed being lowest for computing devices 220 that are closest to the exhaust vent 300 (as indicated by arrows 430), then gradually increasing for computing devices 220 in each column that is farther away from the exhaust opening 300 (as indicated by arrows 420) until the highest fan speed settings are applied to the computing devices 220 that are farthest from the exhaust opening 300 (as indicated by arrows 410). The general direction of exhaust airflow is from the back to the front and out the exhaust opening 300 as indicated by arrow 260.

Figure 5:
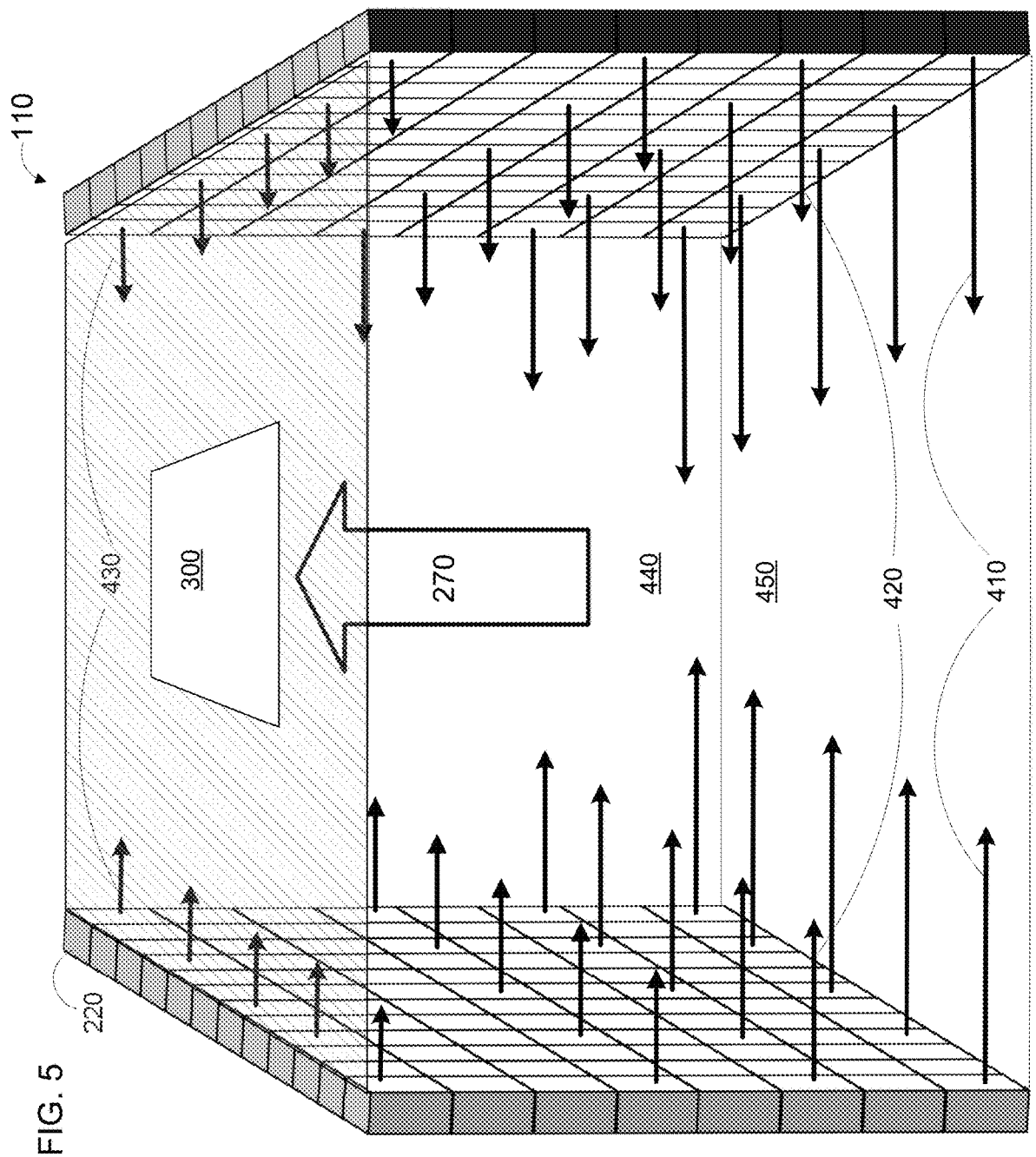
FIG. 5 is another perspective view of another example embodiment of a fan cooling pattern applied to an example pod in a data center according to the teachings of the present disclosure.

Turning now to FIG. 5, a perspective view of another example embodiment of a fan cooling pattern applied to an example pod in a data center is shown. As with the previous example, each cube represents a computing device 220, and arrows indicate the approximate direction and relative air/fan speed. The front, back 440, and floor 450 of the space between the racks of computing devices 220 are sealed, with the top having one or more exhaust openings 300. The pattern of fan settings applied to computing devices 220 is a gradient in this example embodiment, with fan speed being lowest for computing devices 220 that are closest to the exhaust vent 300 (as indicated by arrows 430), then gradually increasing for computing devices 220 in each row that is farther away from the exhaust opening 300 (as indicated by arrows 420) until the highest fan speed settings are applied to the computing devices 220 that are farthest from the exhaust opening 300 (as indicated by arrows 410). The general direction of exhaust airflow is bottom up and out the exhaust opening 300 as indicated by arrow 270. While linear gradient patterns have been illustrated, the pattern or gradient applied can be linear or nonlinear (e.g. exponential, cubic, quadratic). The pattern can also vary in two dimensions, as illustrated in the next example.

Figure 6:
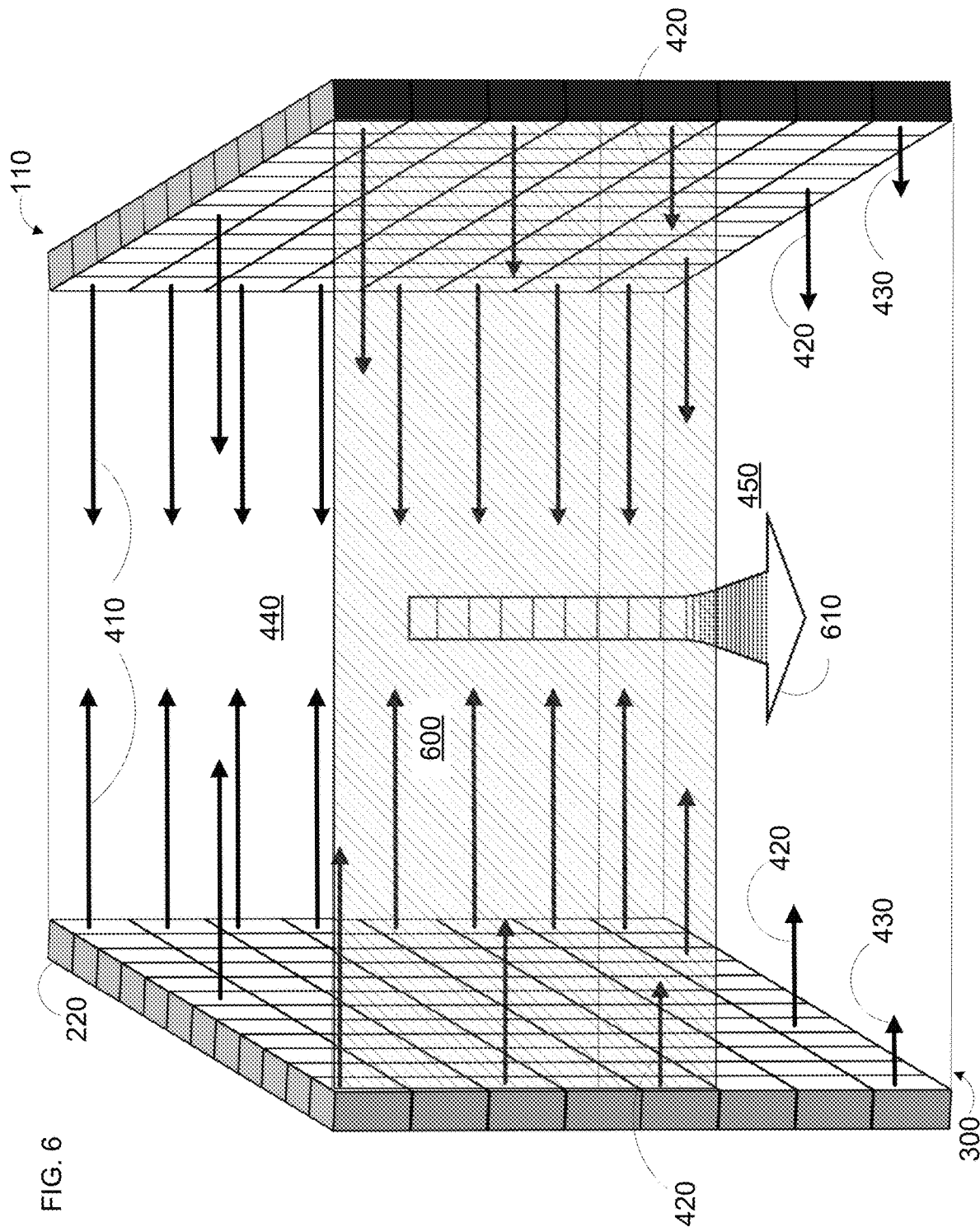
FIG. 6 is another perspective view of an example embodiment of a fan cooling pattern applied to an example pod in a data center according to the teachings of the present disclosure.

Turning now to FIG. 6, a perspective view of another example embodiment of a fan cooling pattern applied to an example pod in a data center is shown. As with the previous example, each cube represents a computing device 220, and arrows indicate the approximate direction and relative air/fan speed. The ceiling, back 440, and floor 450 of the space between the racks of computing devices 220 are sealed, with part of the front being sealed by barrier 600 and part being an exhaust opening 300. The pattern of fan settings applied to computing devices 220 is a two-dimensional gradient in this example embodiment, with fan speed being lowest for computing devices 220 that are closest to the exhaust vent 300 (as indicated by arrows 430), then gradually increasing for computing devices 220 that are farther away from the exhaust opening 300 (as indicated by arrows 420) until the highest fan speed settings are applied to the computing devices 220 that are farthest from the exhaust opening 300 (as indicated by arrows 410). The general direction of exhaust airflow is down and out the exhaust opening 300 as indicated by arrow 610. Exhaust openings are generally preferably positioned higher because the heated air naturally rises, but limitations in the building used for the particular data center may dictate other positions like the one illustrated.

Figure 7:
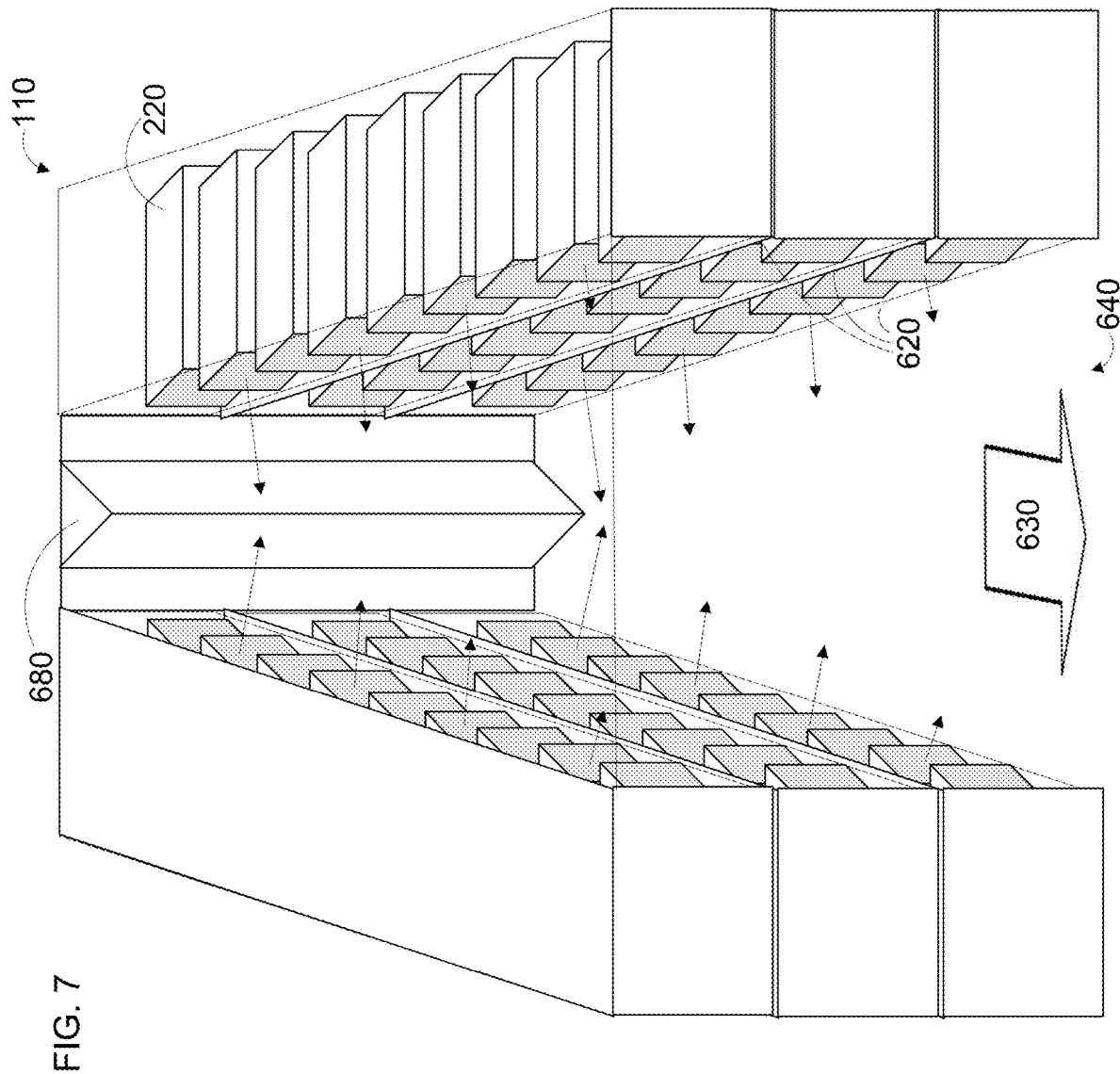
FIG. 7 is another perspective view of an example embodiment of a fan cooling pattern applied to an example pod in a data center according to the teachings of the present disclosure.

Turning now to FIG. 7, an illustration of another example embodiment of a system for cooling devices in a data center is shown. In this example embodiment, each computing device 220 is positioned so as direct exhaust heat at an angle (i.e., not perpendicular to the shelves 620). This angle may be substantially consistent across all computing devices 220, or the angle may gradually increase the closer the computing devices are to the exhaust opening 640. This angle contributes to the airflow out the exhaust opening 640, as indicated by arrow 630. In some embodiments, there may also be one or more air deflectors 680 positioned between the opposing racks in pod 110. Air deflectors 680 may be used to compensate for obstructions (e.g., pillars) within the pod and may be angled to direct exhaust air toward exhaust opening 640.

Figure 8:
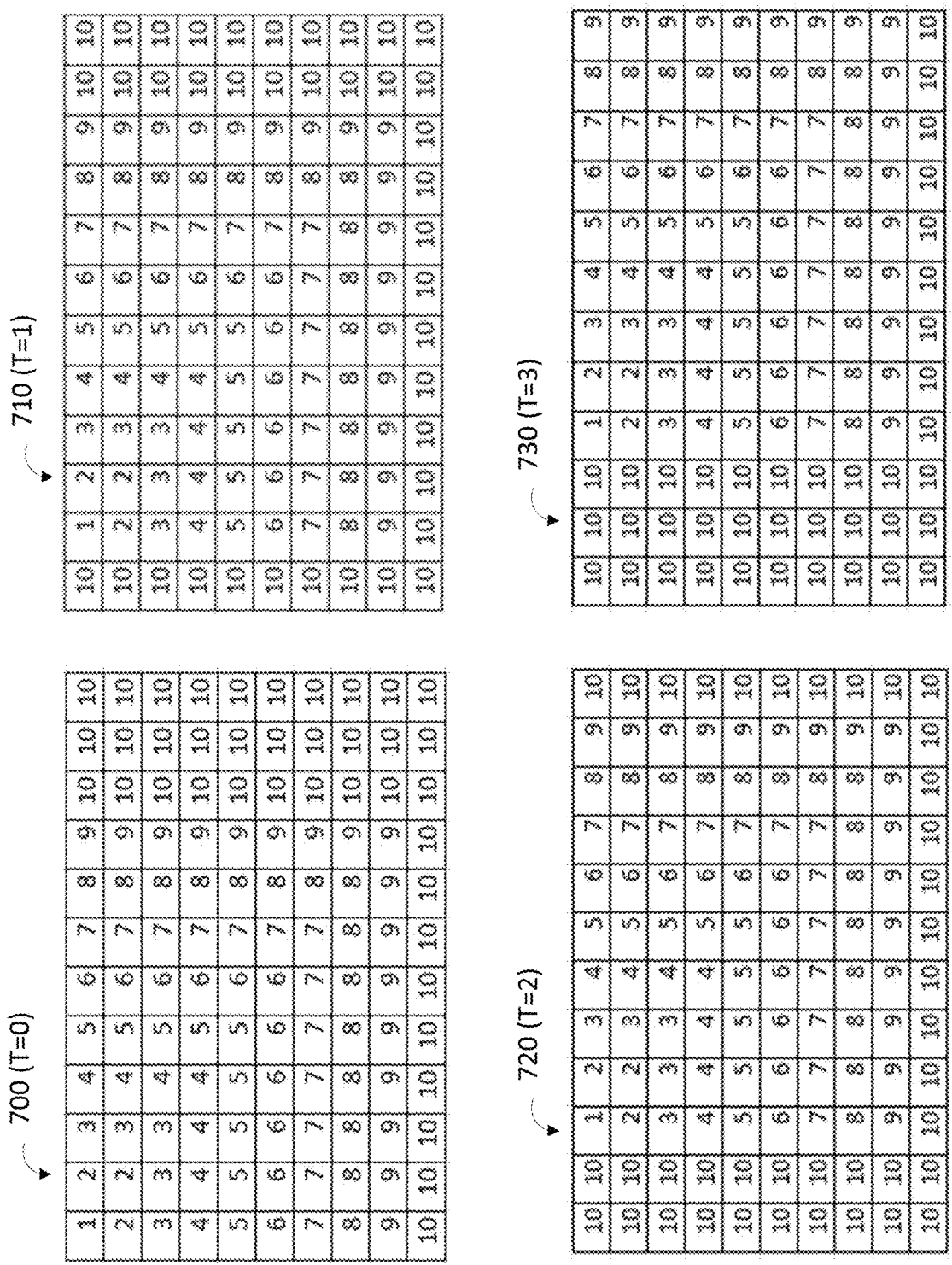
FIG. 8 is an illustration of an example embodiment of a pattern for fan power settings according to the teachings of the present disclosure.

Turning now to FIG. 8, an illustration of an example embodiment of a pattern for fan power settings is shown. In this embodiment, each cell represents a percentage of maximum fan speed, for example with 10 representing 100% of the computing device's maximum fan speed, 9 representing 90% of the computing device's maximum fan speed, and so on. In this embodiment, the pattern changes over time, with pattern 700 being a first pattern sent to the computing devices on a rack at a starting time T=0, pattern 710 being a second pattern sent to the same computing devices at a later time T=1, pattern 720 being a third pattern sent to the same computing devices at a still later time T=3, and pattern 730 being a fourth pattern sent to the same computing devices at a later time T=4.

In some embodiments, the pattern may be periodically shifted and or rotated and resent to the computing devices as shown. This coordinated dynamic changing of fan speeds may beneficially be used to prevent static areas with reduced air flow that may build up heat and create hot spots in the rack, pod, or data center. The pattern shifting may be horizontal, vertical, or some combination thereof. In some embodiments, entirely different patterns may be applied at different times to the computing devices instead of, or in combination with, shifting and or rotating a single pattern.

In some embodiments, the pattern may comprise not only fan settings, but a combination of fan settings and one or more other operating settings for the computing devices (e.g., voltage levels and operating frequencies) that also impact the heat generation and cooling of the computing device.

Figure 9:
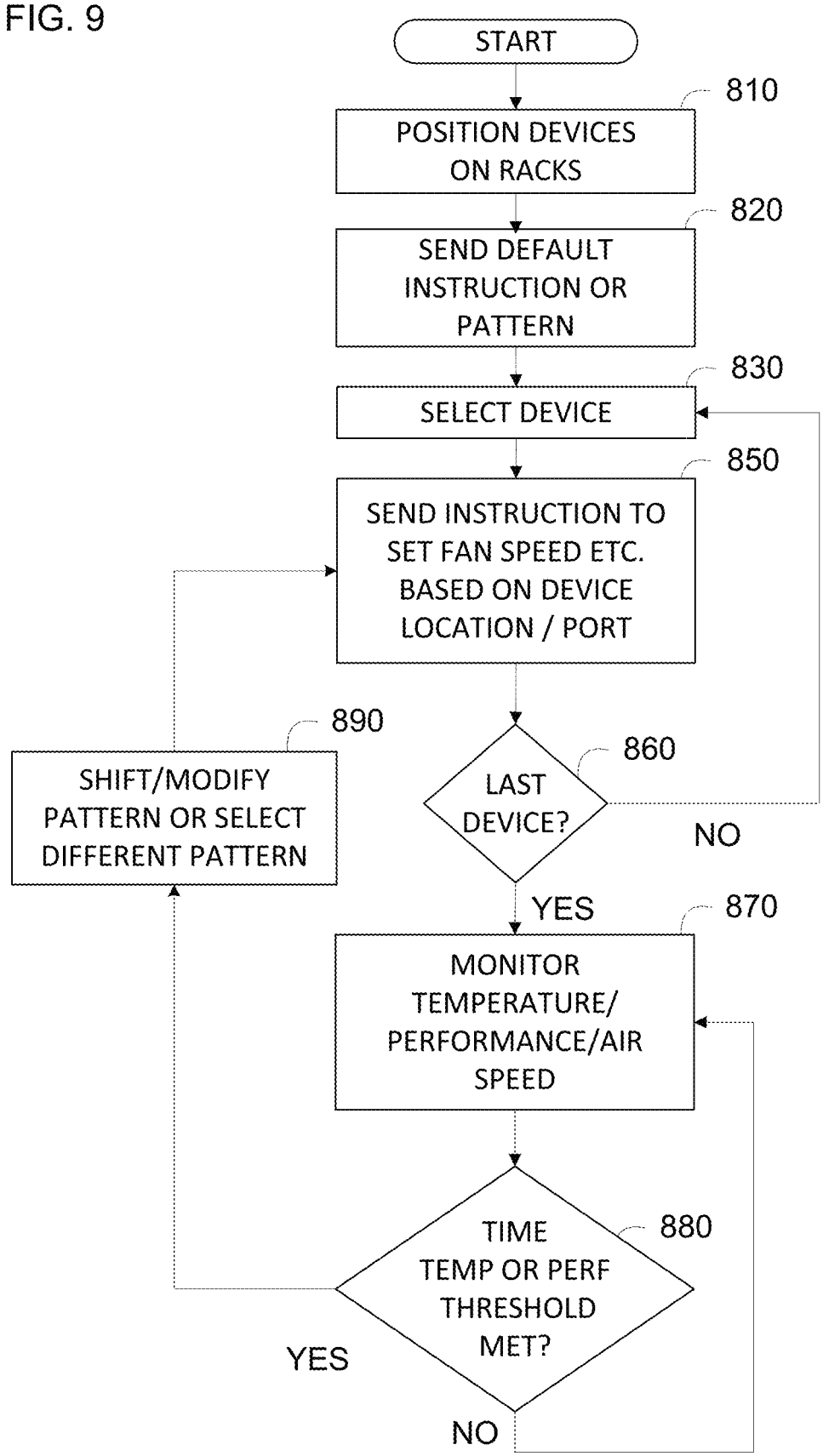
FIG. 9 is a flow chart of an example embodiment of a method for cooling computing devices in a data center according to the teachings of the present disclosure.

Turning now to FIG. 9, a flow chart of an example embodiment of a method for cooling computing devices in a data center according to the teachings of the present disclosure is shown. This method may for example be implemented in software as a management application executing on a management computer that manages the computing devices in the data center. In the embodiment illustrated in the figure, the computing devices are positioned on racks (step 810), and a default instruction that sets an initial pattern is sent (step 820). The instruction is applied to the computing devices by selecting each device (step 830) and sending the appropriate management instruction or instructions to the device (step 850). The management instructions may set the fan speed to a particular value (e.g., percentage of maximum fan speed, tachometer or rotations per minute (RPM) setting, a pulse width modulation (PWM) setting such as duty cycle), or device voltage level or operating frequency, or some combination thereof. Depending on the computing devices being managed, this may be accomplished in a number of different ways, for example via SSH, TCP/IP, HTTP or other network protocol. This is repeated for each device until the last device is set (step 860). The temperature and/or performance of the computing devices is monitored (step 870), and if any thresholds are met such as a maximum desired temperature or performance below a certain threshold (step 880), a new pattern may be selected, or a pattern shift, change, or sequence of shifts/changes may be triggered (step 890). In addition to temperature in the computing device, temperature at various locations in the data center may be measured via network-enable thermometers, and the airspeed of air through or near the computing devices may be monitored (step 870) by reading a speed value from one or more tachometers connected to one or more of the computing devices fans, or by reading values from one or more network-connected airspeed detectors placed at measuring locations within the hot aisle(s) of the data center.

Figure 10:
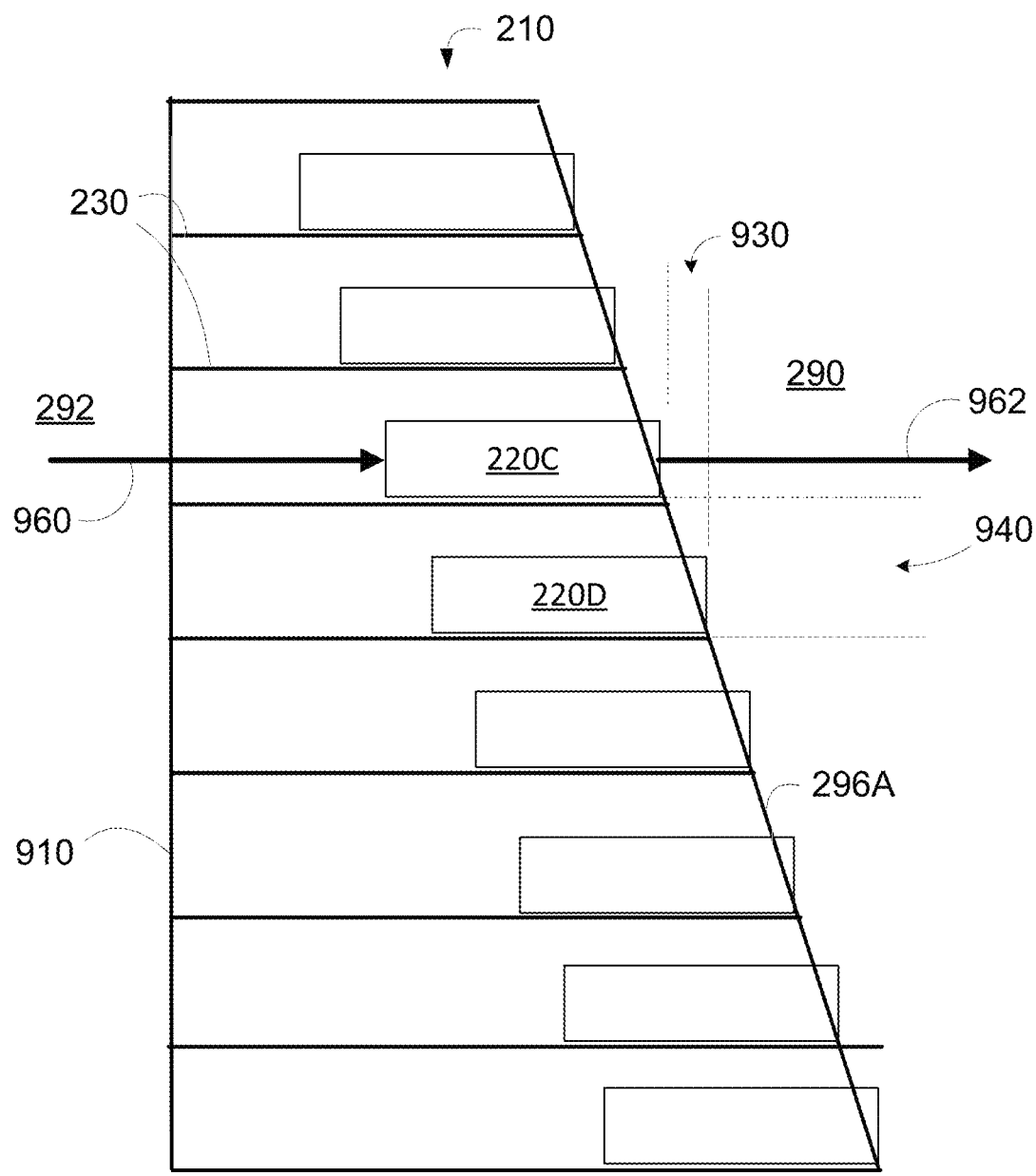
FIG. 10 is an illustration of an example embodiment of a rack for positioning computing devices in a data center according to the teachings of the present disclosure.

Turning now to FIG. 10, a vertical cross-section of an example embodiment of a rack 210 for positioning computing devices in a data center is shown. In this embodiment, the rack 210 comprises a number of shelves 230 configured with one or more positions each to support computing devices 220 such as computing device 220C and 220D. Computing device 220C is configured to draw air in from cold aisle 292 as indicated by arrow 960 and then expel heated exhaust air out into hot aisle 290 as indicated by arrow 962. The shelves 230 are supported vertically by vertical support member 910 and positioned at vertical intervals 940. Vertical support members 910 may be traditional metal server cabinet sides, or modular shelving rods with brackets to support the shelves 230 at fixed vertical positions, or they may be adjustable vertically based on the size of computing devices 220. The shelves 230 are also beneficially sloped, with positions for computing devices 220 that are offset horizontally from each other as shown by offset 930. This may beneficially improve airflow in hot aisle 290. The rack 210 also includes an air flow barrier 296A that fills the area around each computing device 220 and prevents hot air from flowing from hot aisle 290 to cold aisle 292. When this embodiment of rack 210 is placed opposite itself in pairs within a pod (see FIG. 2 for an example of two opposing racks in a pod), the bottoms of the racks 210 will be closer together than the top. This may improve airflow out of hot aisle 290 when there are one or more exhaust openings near the top of the racks (e.g., on the ceiling of the hot aisle 220). While in this example shelves 230 are shown having different lengths, other implementations are possible and contemplated as will be shown in subsequent figures.

Figure 11:
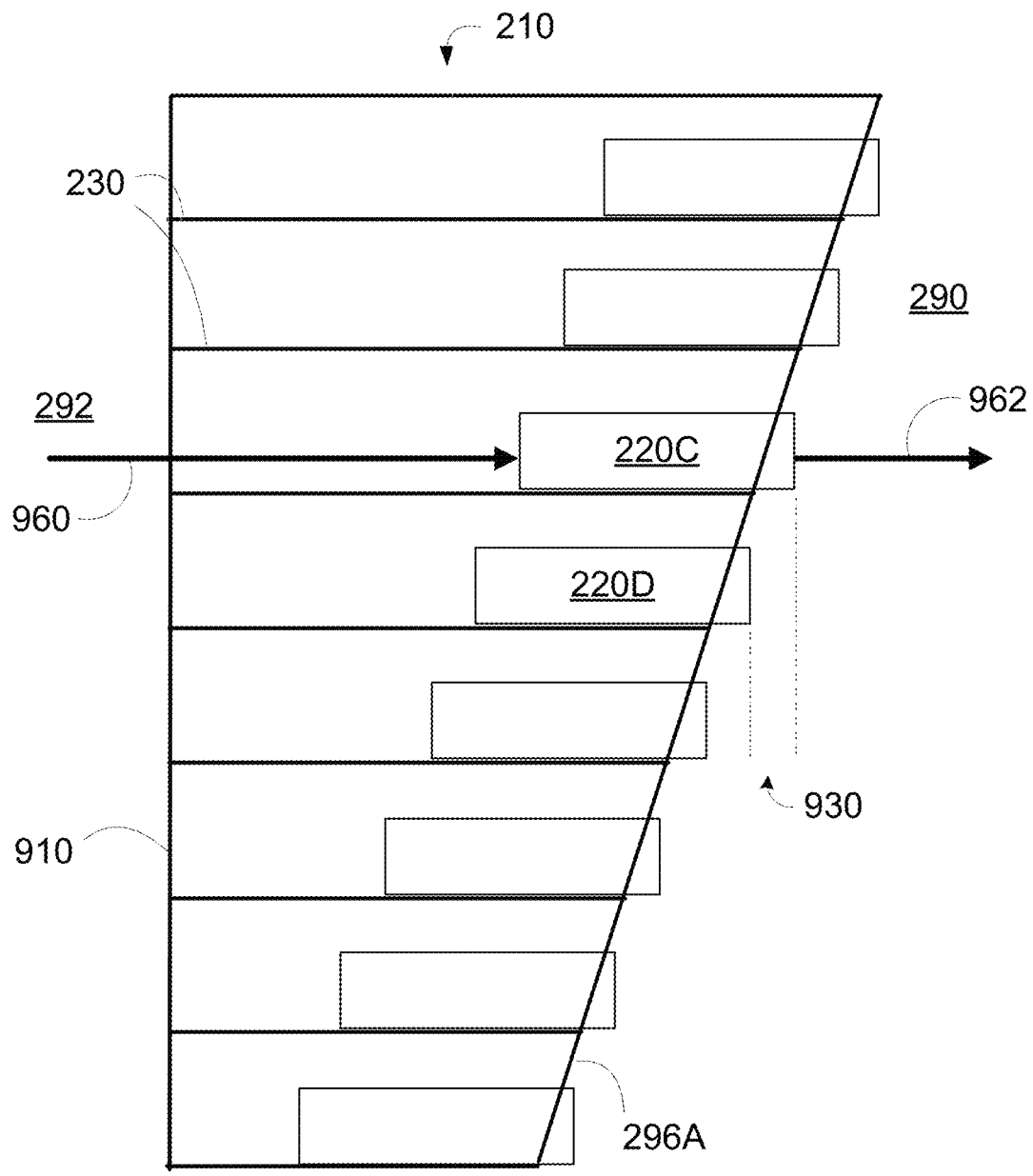
FIG. 11 is an illustration of another example embodiment of a rack for positioning computing devices in a data center according to the teachings of the present disclosure.

Turning now to FIG. 11, another example embodiment of a rack for positioning computing devices in a data center is shown. In this embodiment, shelves 230 within rack 210 are also horizontally offset 930, but with the larger shelves at the top. When this embodiment of rack 210 is placed opposite itself in pairs within a pod, the tops of the racks are closer together than the bottom. This may improve airflow out of the hot aisle 290 when there are one or more exhaust openings near the bottom of the racks (a less common configuration since heat rises, but it may be necessary for data centers using existing buildings with exhaust opening position constraints).

Figure 12:
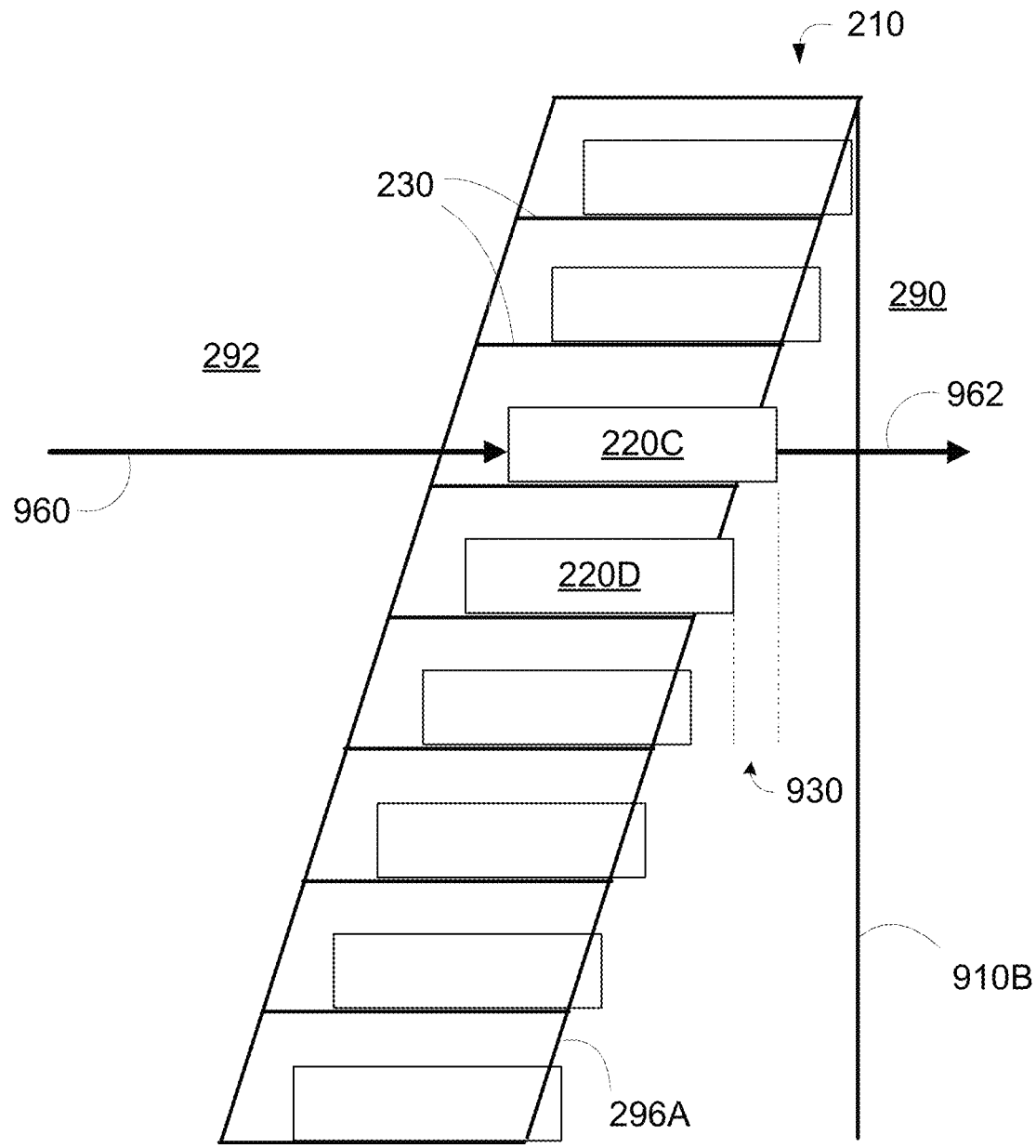
FIG. 12 is an illustration of another example embodiment of a rack with equal-sized shelves for positioning computing devices in a data center according to the teachings of the present disclosure.

Turning now to FIG. 12, another example embodiment of a rack for positioning computing devices in a data center is shown. In this example, each shelf is the same length, but the shelves have both vertical and horizontal offsets 930. As computing devices may be heavy, this embodiment of rack 210 includes an optional additional vertical support beam 910B to improve stability and weight bearing capacity. As with previous examples, the cool air moves from cold aisle 292 into the computing device 220 and then the heated exhaust is forced into hot aisle 290 (as shown by arrows 960 and 962). Airflow barrier 296A is present as in previous examples to prevent hot air from flowing back from hot aisle 290 to cold aisle 292 through the spaces in rack 210 around computing devices 220.

Figure 13:
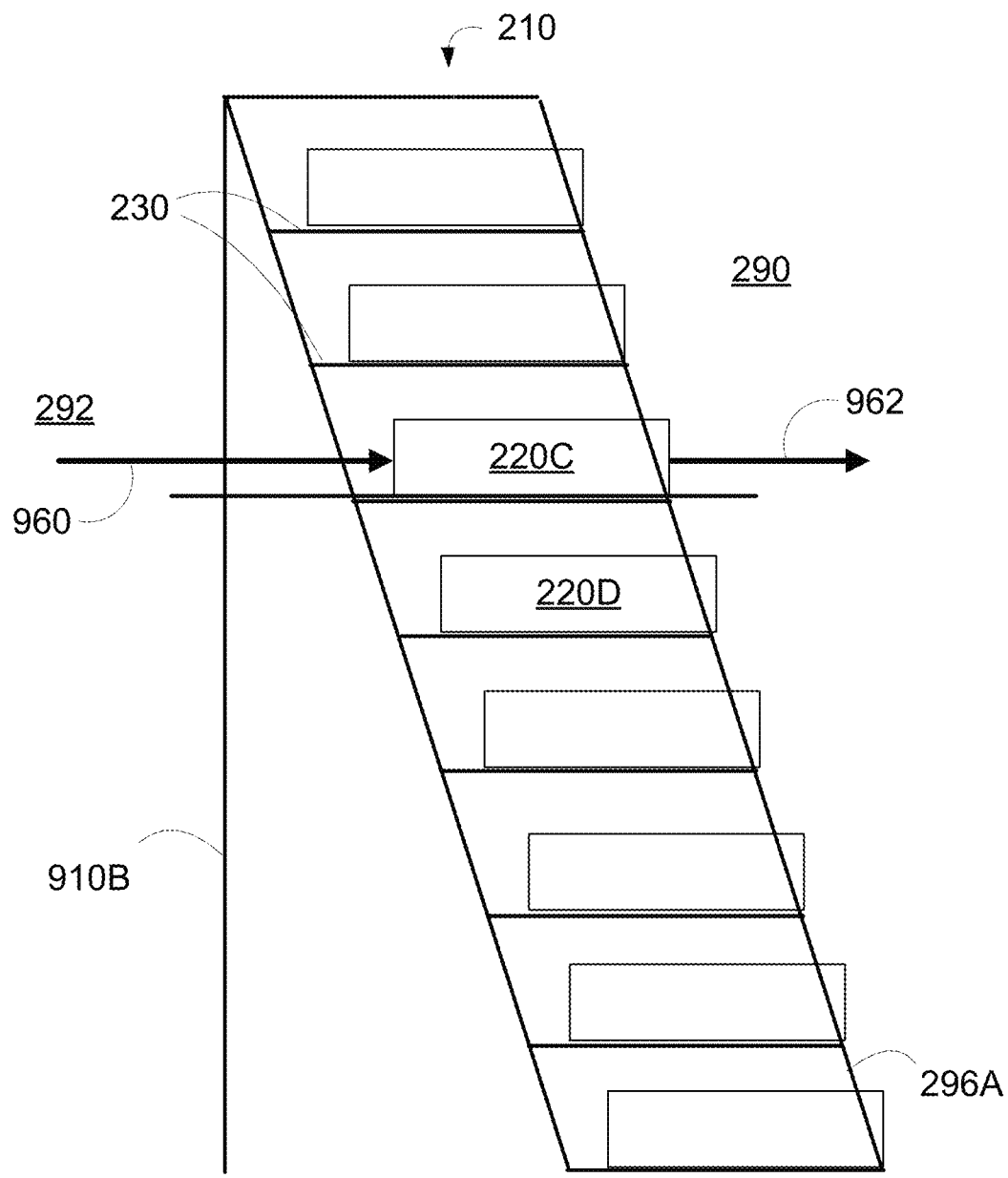
FIG. 13 is an illustration of an additional example embodiment of a rack for positioning computing devices in a data center according to the teachings of the present disclosure.

Turning now to FIG. 13, another example embodiment of a rack for positioning computing devices in a data center is shown. In this example, as with the previous example, the shelves 230 in rack 210 are the same size but vertically and horizontally offset from each other, with optional vertical support member 910B supporting rack 210 from within the cold aisle 292.

Figure 14:
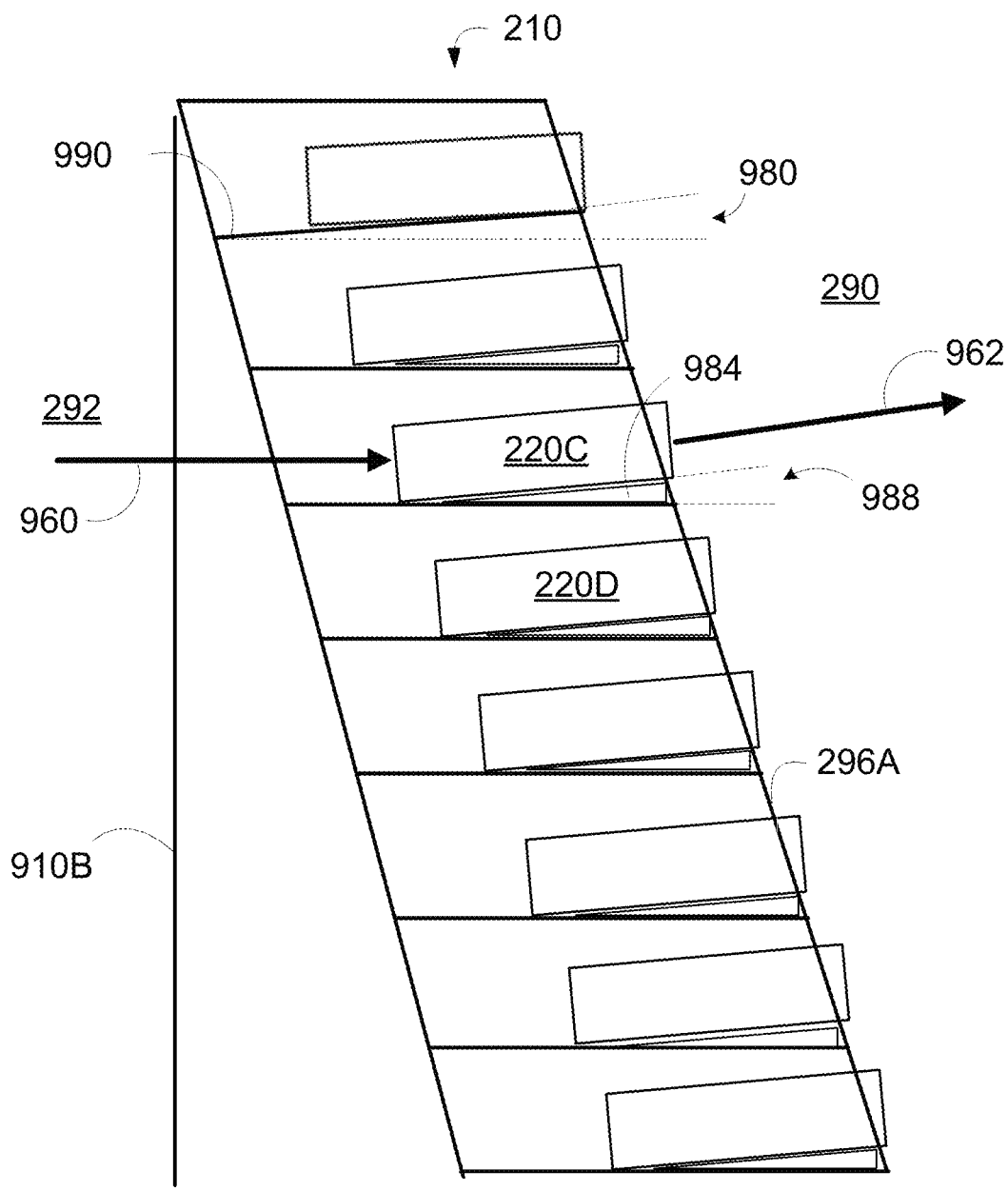
FIG. 14 is an illustration of an additional example embodiment of a rack with angled positions for hold computing devices according to the teachings of the present disclosure.

Turning now to FIG. 14, another example embodiment of rack 210 is shown, this time with angled positions for computing devices 220. The angled positions may be formed by angling the shelves in the rack 210 as shown with vertically angled shelf 990 that creates vertical angle 980, or with the use of spacer blocks or shims 984 that create vertical angle 988. As with previous examples, cold air is drawn into computing devices 220 from cold aisle 292, but hot exhaust air is expelled at a vertical angle (e.g., angles 980 and 988) as shown by arrow 962 rather than parallel with the floor of the data center. The angle may be chosen based on the position of the nearest exhaust vent in hot aisle 290 and need not be consistent across all computing devices 220. For example, computing device 220C may be positioned with a slightly higher angle than computing device 220D. In this embodiment air barrier 296A is a planar barrier that may be made of one or more coplanar panels to prevent air leakage from hot aisle 290.

Figure 15:
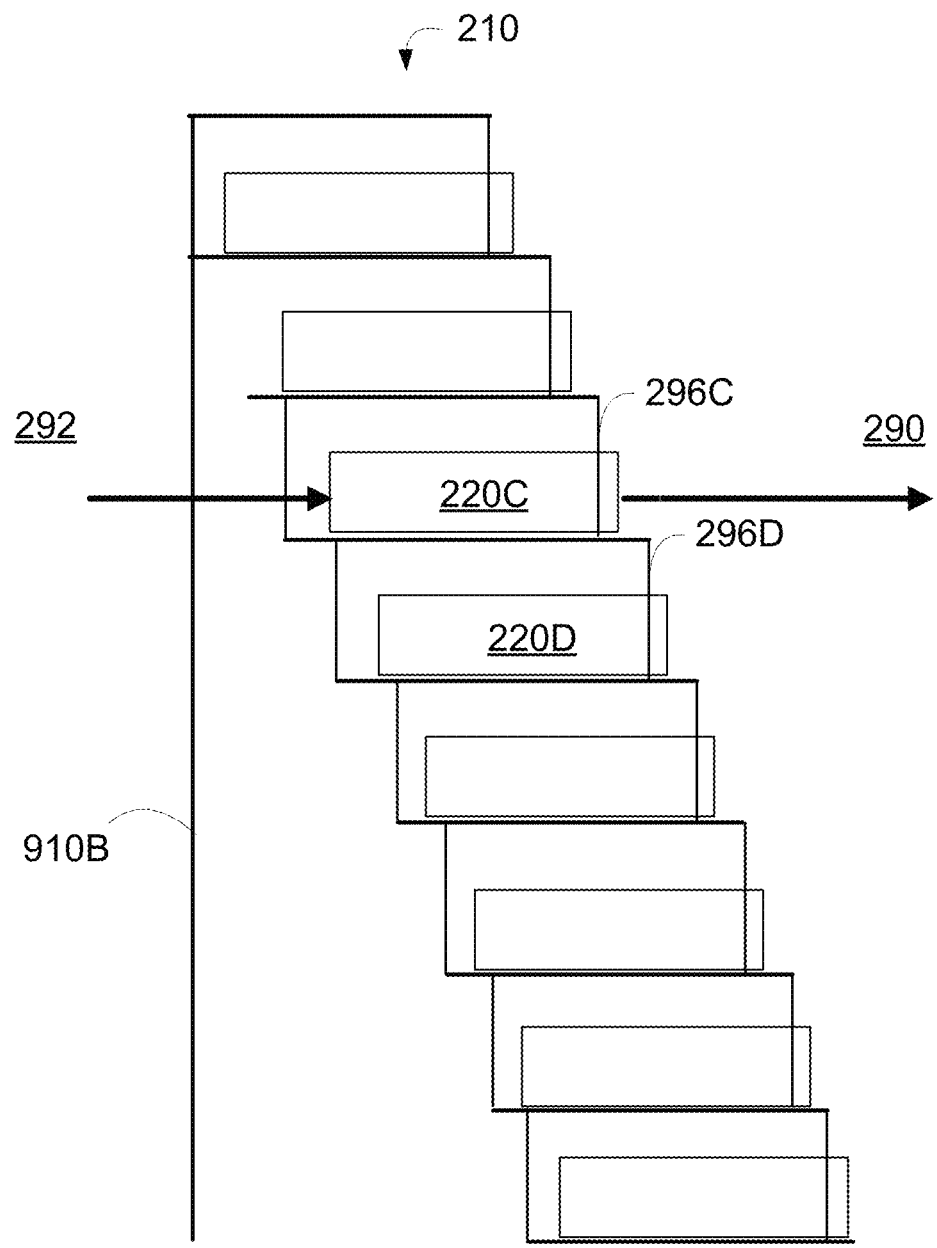
FIG. 15 is an illustration of another additional example embodiment of a rack with offset device positions and air barriers according to the teachings of the present disclosure.

Turning now to FIG. 15, another additional example embodiment of a rack with offset device positions and air barriers is shown. In this embodiment, the air barrier that prevents hot air from hot aisle 290 from escaping to cold aisle 292 is a series of individual panels (e.g., panels 296C and 296D), rather than one sloped surface as in the example of FIG. 14. This type of air barrier may be used in combination with the other features described earlier, including angled positions for computing devices.

Figure 16:
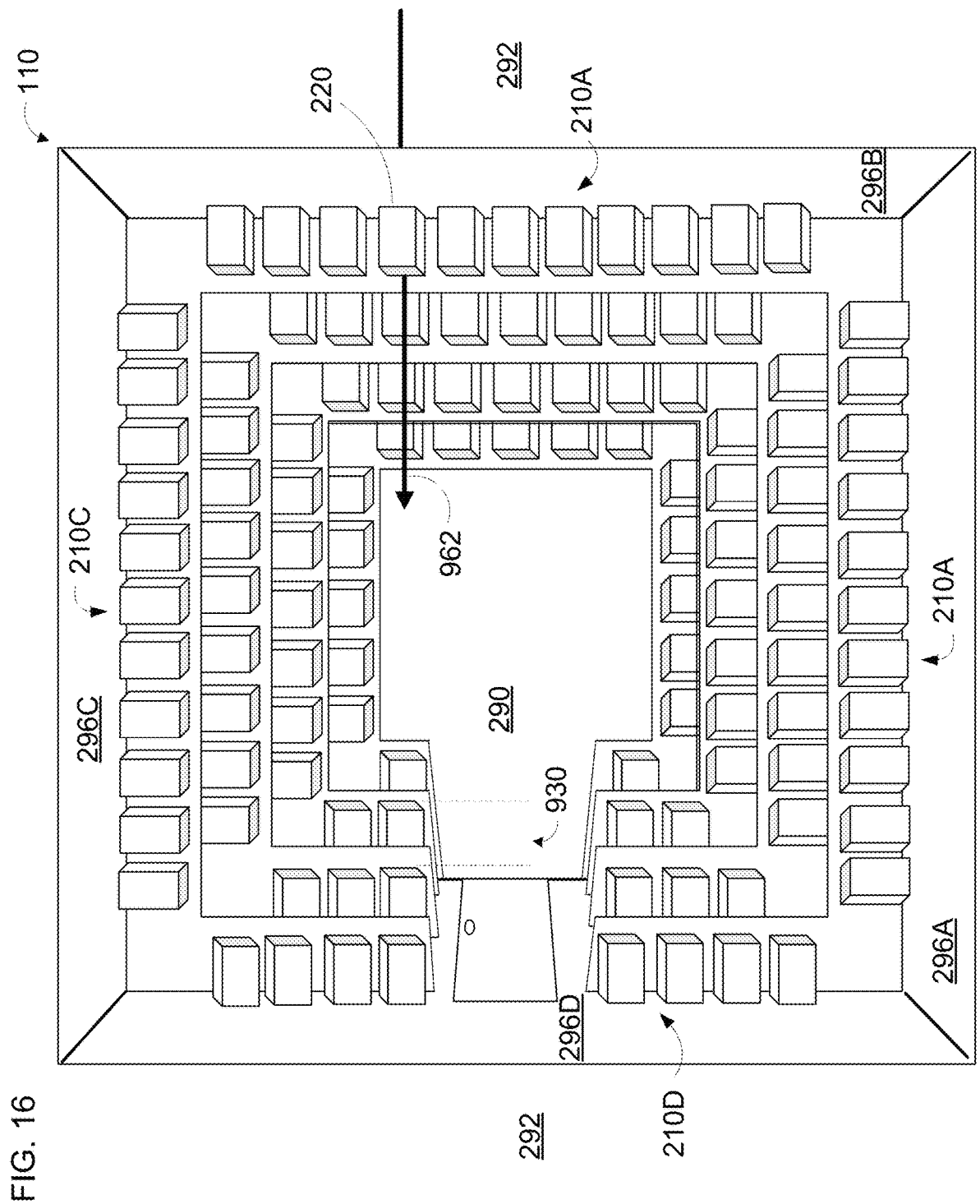
FIG. 16 is a top view of an example embodiment of a regular polygon pod formed by multiple racks according to the teachings of the present disclosure.

Turning now to FIG. 16, an example embodiment of a pod 110 created by multiple racks configured together to form a regular polygon pod is shown. In this embodiment, four racks 210A-210D are configured in a square with hot aisle 290 in the center. Racks 210A-D hold computing devices 220 in positions that are vertically and horizontally offset from computing devices on neighboring shelves. The computing devices 220 draw cool air from cold aisle 292 (which is outside pod 110), into the computing device and exhausts heat into hot aisle 290 in the center of pod 110. The exhaust opening for hot aisle 290 is in the ceiling (not shown in this figure). In addition to being vertically and horizontally offset as illustrated, the computing devices may also be vertically angled (as described in connection with the example in FIG. 14). While a square is illustrated, other regular polygons are possible and contemplated (e.g. pentagons, hexagons, and octagons).

Figure 17:
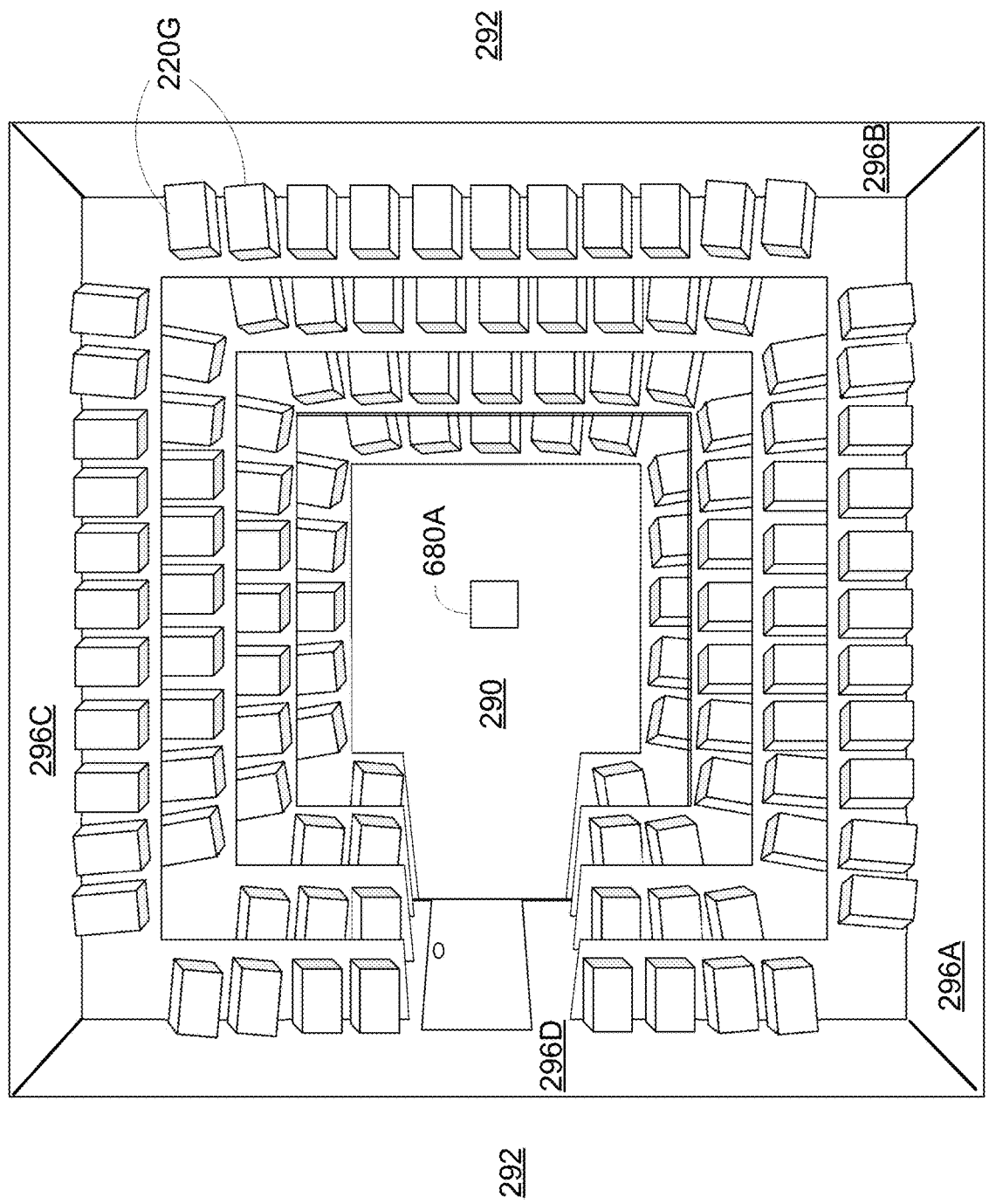
FIG. 17 is a top view of another example embodiment of a pod formed by multiple racks configured together with offset and angled device positions to form a regular polygon according to the teachings of the present disclosure.

Turning now to FIG. 17, another example embodiment of a pod 110 created by multiple racks configured together to form a regular polygon is shown. In this example embodiment, some computing devices 220G are horizontally angled to direct their exhaust to the center of the hot aisle 290. In other embodiments where hot aisle 290 has multiple exhaust openings, computing devices may be positioned at horizontal and or vertical angles in order to better direct their exhaust to the nearest exhaust opening of hot aisle 290. In addition to being vertically and horizontally offset and horizontally angled as illustrated, the computing devices may also be vertically angled (as described in connection with the example in FIG. 14). In this embodiment, pod 110 may also include a deflector 680A that is positioned near the center of the hot aisle 290 to help direct exhaust air flow from computing devices 220 to the exhaust opening of hot aisle 290. Deflector 680A may be configured to have the same horizontal cross-section as pod 110 but on a smaller scale. Deflector 680A may taper and get smaller in cross-section the closer that deflector 680A gets to the hot aisle's exhaust opening.

Figure 18:
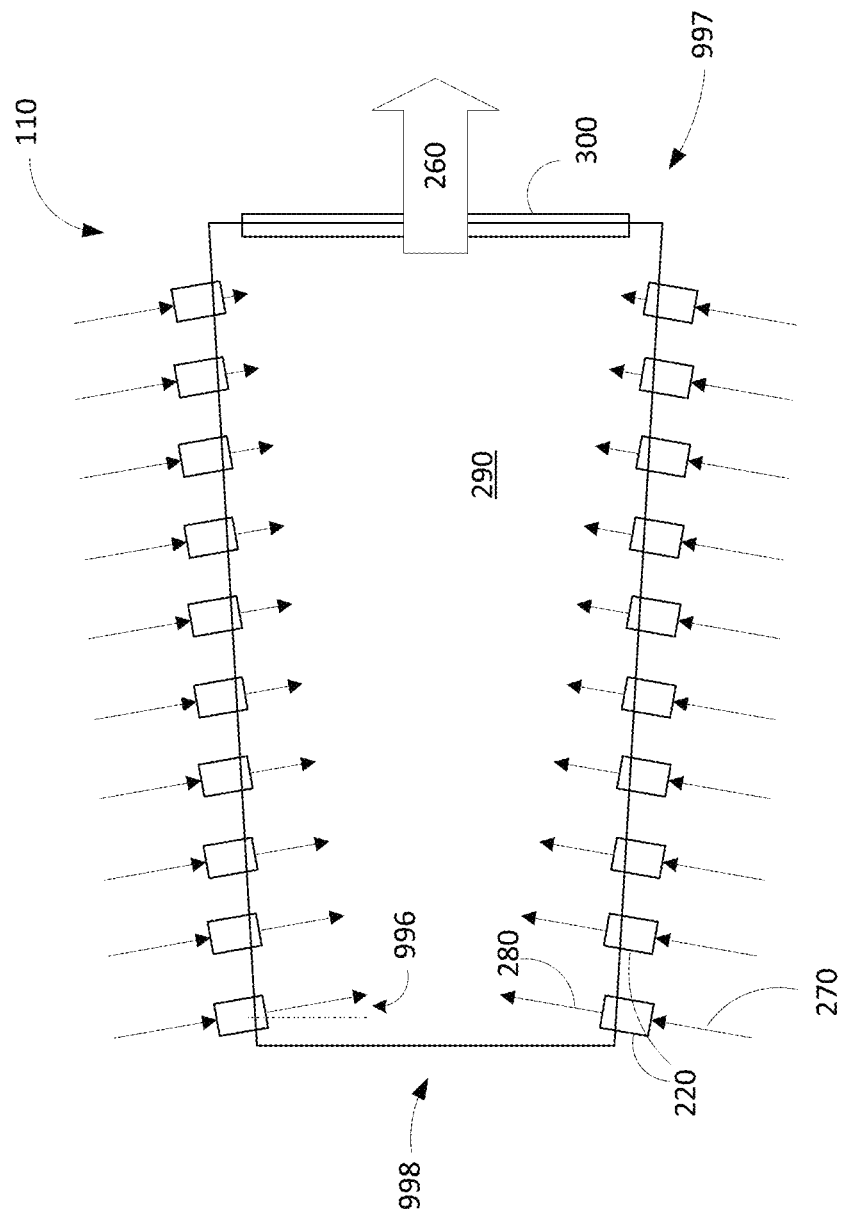
FIG. 18 is a top view illustration of another example embodiment of multiple racks configured together with one end closer to each other according to the teachings of the present disclosure.

Turning now to FIG. 18, another example embodiment of multiple racks configured together with one end closer to each other to improve airflow is shown. Traditional data center design utilizes parallel opposing racks, but in some embodiments positioning racks with one end closer together may be beneficial. In this example embodiment, the racks are positioned closer at end 998 (which is farther away from exhaust opening 300) and farther apart at end 997 (which is closer to exhaust opening 300). This may be combined with angled computing device positions (as shown by angle 996) and sloped racks having horizontally offset computing device positions (illustrated in prior figures).

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for operating a plurality of computing devices having cooling fans, the method comprising:
    positioning the plurality of computing devices on a plurality of shelves in one or more racks such that each of the computing devices on each of the shelves intakes air from a cold aisle on a first side of the shelf and exhausts hot air to a hot aisle on a second side of the shelf, wherein the computing devices on each shelf are offset horizontally from the computing devices on neighboring shelves; and
    sealing the area around each computing device such that the exhausted hot air cannot pass from the hot aisle to the cold aisle;
    wherein the hot aisle has one or more exhaust openings, the method further comprising angling the computing devices vertically and horizontally to point toward the nearest hot aisle exhaust opening.

2. The method of claim 1, further comprising positioning the racks opposite each other at an angle horizontally to each other such that they are not parallel and the hot aisle is narrower at one end than the other;
    wherein angles of the plurality of computing device are larger for computing devices that are closer to an exhaust opening of the hot aisle.

3. The method of claim 1, wherein at least two of the computing devices on at least one shelf of the plurality of shelves are disposed at different horizontal angles.

4. The system method of claim 1, wherein the first plurality of shelves include shelves of different lengths.

5. The method of claim 1, wherein the one or more racks includes a plurality of racks configured in a regular polygon such that at least one rack of the plurality of racks is disposed at each side of the regular polygon, and
    the plurality of racks are configured for disposing at least some of the plurality of computing devices horizontally angled toward a center of the regular polygon.

6. A system for supporting a plurality of computing devices in a data center, the system comprising:
    a first rack;
    a second rack;
    a first plurality of shelves; and
    a first plurality of vertical support members configured to hold the first plurality of shelves at a first set of vertical offsets within the first rack,
    wherein each of the first plurality of shelves has one or more positions for holding one of the plurality of computing devices,
    wherein each position on each shelf is offset horizontally from the positions on neighboring shelves,
    wherein second rack is offset from the first rack to form a hot aisle between the first rack and the second rack,
    wherein the first and second rack each further comprise a barrier with a plurality of openings, and
    wherein the barrier fills an area around each computing device and prevents airflow into the hot aisle except for the openings which permit exhaust from the plurality of computing devices to pass, and
    wherein the first plurality of shelves include shelves of different lengths.

7. The system of claim 6, wherein the hot aisle has one or more exhaust openings, and the computing devices are vertically and horizontally angled to point toward the nearest hot aisle exhaust opening.

8. The system of claim 6, wherein the barrier includes a series of individual panels.

9. The system of claim 6, wherein the second rack comprises a second plurality of shelves and a second plurality of vertical support members configured to hold the second plurality of shelves at a second set of vertical offsets within the second rack, wherein each of the second plurality of shelves has one or more positions for holding one of the plurality of computing devices, wherein the computing devices in the first rack and the second rack are each in a sloped array, and wherein the sloped arrays are closer to each other at the bottom than at the top.

10. The system of claim 9, wherein the first rack and second rack are closer to each other at one horizontal end.

11. The system of claim 10, further comprising an air deflector positioned between the first rack and the second rack in the hot aisle, wherein the air deflector directs exhaust air from the computing devices on the first and second racks to a nearest hot aisle exhaust opening.

12. The system of claim 6, wherein each shelf is configured to support the computing devices in a position that points to a nearest hot aisle exhaust opening.

13. The system of claim 6, wherein the second rack comprises a second plurality of shelves and a second plurality of vertical support members configured to hold the second plurality of shelves at a second set of vertical offsets, wherein each of the second plurality of shelves has one or more positions for holding one of the plurality of computing devices, wherein the computing devices in the first rack and the second rack are each in a sloped array, wherein the sloped arrays are closer at the bottom than at the top.

14. The system of claim 13, wherein the first rack and second rack are closer to each other at one horizontal end.

15. A system for supporting a plurality of computing devices in a data center, the system comprising:
    a plurality of racks configured in a regular polygon to form a hot aisle between the racks;
    a plurality of shelves in each of the racks; and
    a plurality of vertical support members in each rack configured to hold the shelves at a set of vertical offsets, wherein each of the plurality of shelves has one or more positions for holding one of the plurality of computing devices, wherein each position on each shelf is offset horizontally from the positions above and below;
    wherein the plurality of racks are disposed such that at least one rack of the plurality of racks is disposed at each side of the regular polygon; and
    wherein the plurality of racks are configured for disposing at least some of the plurality of computing devices horizontally angled toward a center of the regular polygon.

16. The system of claim 15, wherein each position is angled vertically to direct exhaust from the computing device to an exhaust port at the center of the hot aisle ceiling.

17. The system of claim 15, wherein one or more positions are angled vertically to direct exhaust from the computing devices to the nearest exhaust port.

18. The system of claim 15, further comprising an air deflector at the center of the regular polygon.

19. The system of claim 18, wherein a cross-section of the air deflector decreases toward an exhaust port.

20. The system of claim 15, wherein the plurality of shelves include shelves of different lengths.

\* \* \* \* \*